(12) United States Patent
Liu et al.

(10) Patent No.: US 10,083,988 B2
(45) Date of Patent: Sep. 25, 2018

(54) COMPLEMENTARY THIN FILM TRANSISTOR AND MANUFACTURING METHOD THEREOF, ARRAY SUBSTRATE, DISPLAY APPARATUS

(71) Applicant: BOE TECHNOLOGY GROUP CO., LTD., Beijing (CN)

(72) Inventors: Xiaodi Liu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 59 days.

(21) Appl. No.: 14/429,165

(22) PCT Filed: Jun. 19, 2014

(86) PCT No.: PCT/CN2014/080270
§ 371 (c)(1),
(2) Date: Mar. 18, 2015

(87) PCT Pub. No.: WO2015/067054
PCT Pub. Date: May 14, 2015

(65) Prior Publication Data
US 2016/0035753 A1 Feb. 4, 2016

(30) Foreign Application Priority Data
Nov. 11, 2013 (CN) .......................... 2013 1 0557091

(51) Int. Cl.
*H01L 27/12* (2006.01)
*H01L 29/786* (2006.01)

(52) U.S. Cl.
CPC ........ *H01L 27/1214* (2013.01); *H01L 27/127* (2013.01); *H01L 27/1233* (2013.01);
(Continued)

(58) Field of Classification Search
CPC .................................................. H01L 27/1214
See application file for complete search history.

(56) References Cited

U.S. PATENT DOCUMENTS

| 6,528,816 B1 * | 3/2003 | Jackson | H01L 27/1214 257/368 |
|---|---|---|---|
| 2008/0182368 A1 * | 7/2008 | Kunii | H01L 27/1214 438/158 |
| 2012/0135578 A1 * | 5/2012 | Steen | H01L 21/2652 438/302 |

FOREIGN PATENT DOCUMENTS

| CN | 1312958 A | 9/2001 |
|---|---|---|
| CN | 101150092 A | 3/2008 |

(Continued)

OTHER PUBLICATIONS

Machine translation of CN 103579115A.*
(Continued)

*Primary Examiner* — Michael Lebentritt
*Assistant Examiner* — Suberr Chi
(74) *Attorney, Agent, or Firm* — Nath, Goldberg & Meyer; Joshua B. Goldberg; Scott H. Blackman

(57) ABSTRACT

The present invention provides a complementary thin film transistor and a manufacturing method thereof, an array substrate and a display apparatus, relates to the field of manufacturing technology of thin film transistor, and can solve the problem that active layer materials of first and second thin film transistors in a complementary thin film transistor of the prior art have influence with each other. The manufacturing method of the present invention comprises steps of: forming a pattern comprising an active layer of a first thin film transistor and a protective layer on a base by a patterning process, and the protective layer is at least located above the active layer of the thin film transistor; and forming a pattern of an active layer of a second thin film (Continued)

transistor on the base subjected to above step by a patterning process. The present invention may be applied to various circuits and systems.

13 Claims, 3 Drawing Sheets

(52) U.S. Cl.
CPC ........ *H01L 27/1259* (2013.01); *H01L 29/786* (2013.01); *H01L 29/78696* (2013.01)

(56) References Cited

FOREIGN PATENT DOCUMENTS

| | | |
|---|---|---|
| CN | 103579115 A | 2/2014 |
| CN | 103715147 A | 4/2014 |
| CN | 103715196 A | 4/2014 |
| JP | 05145073 A | 6/1993 |

OTHER PUBLICATIONS

Written Opinion of the International Searching Authority issued in International Application No. PCT/CN2014/080270 dated Aug. 29, 2014 (dated Aug. 29, 2014).
1st Office Action issued in Chinese Application No. 201310557091.4 dated Dec. 1, 2014 (dated Dec. 1, 2014).
2nd Office Action issued in Chinese Application No. 201310557091.4 dated Apr. 29, 2015 (dated Apr. 29, 2015).
International Search Report dated Jun. 19, 2014 corresponding to application No. PCT/CN2014/080270.

* cited by examiner

COMPLEMENTARY THIN FILM TRANSISTOR AND MANUFACTURING METHOD THEREOF, ARRAY SUBSTRATE, DISPLAY APPARATUS

This is a National Phase Application filed under 35 U.S.C. 371 as a national stage of PCT/CN2014/080270, filed Jun. 19, 2014, an application claiming the benefit of Chinese Application No. 201310557091.4, filed Nov. 11, 2013, the content of each of which is hereby incorporated by reference in its entirety.

FIELD OF THE INVENTION

The present invention relates to the technical field of manufacturing technology of thin film transistor, and particularly relates to a complementary thin film transistor and a manufacturing method thereof, an array substrate, a display apparatus.

BACKGROUND OF THE INVENTION

Each complementary thin film transistor (CMOS TFT) comprises a first thin film transistor and a second thin film transistor, wherein, one of the thin film transistors is a P-type thin film transistor (PMOS TFT), and the other one of the thin film transistors is an N-type thin film transistor (NMOS TFT), thus various circuits and systems which are difficult to be achieved by PMOS TFT or NMOS TFT may be achieved by using CMOS TFT.

As shown in FIG. 1, the conventional manufacturing method of CMOS TFT specifically comprises following steps 1 through 6.

Step 1, forming a pattern of a gate metal layer comprising a gate 21 of the first thin film transistor and a gate 22 of the second thin film transistor on a base 1, and the gate 21 of the first thin film transistor and the gate 22 of the second thin film transistor are electrically connected together.

Step 2, forming a gate insulation layer 3 on the base 1 subjected to the above step.

Step 3, forming a pattern of an active layer 4 of the first thin film transistor on the base 1 subjected to the above steps.

Step 4, forming a pattern of an active layer 5 of the second thin film transistor on the base 1 subjected to the above steps.

Step 5, forming an etching stop layer 6 on the base 1 subjected to the above steps, and etching the etching stop layer 6 to form source and drain contact regions for making a source 71, a drain 72 of the first thin film transistor and a source 81, a drain 82 of the second thin film transistor contact active regions thereof respectively.

Step 6, forming a pattern of a source and drain metal layer comprising the source 71, the drain 72 of the first thin film transistor and the source 81, the drain 82 of the second thin film transistor on the base 1 subjected to the above steps, wherein the drain 72 of the first thin film transistor and the source 81 of the second thin film transistor are adjacent to each other and electrically connected with each other.

As an example, the above steps are described for manufacturing the first and second thin film transistors of bottom gate type. The difference between the method for manufacturing the first and second thin film transistors of top gate type and the above method is mainly in that: first preparing an active layer and then manufacturing a gate, which will not be described in detail here.

The inventors of the present invention found that, there are at least following problems in the prior art: after preparing the active layer 4 of the first thin film transistor, when manufacturing the active layer 5 of the second thin film transistor, since the material of the active layer 4 of the first thin film transistor is different from the material of the active layer 5 of the second thin film transistor, the deposited material of the active layer 4 of the first thin film transistor may be affected, specifically, the film of the active layer of the second thin film transistor, which is deposited after forming the active layer 4 of the first thin film transistor, may contact the active layer 4 of the first thin film transistor, even if the film of the active layer of the second thin film transistor above the active layer 4 of the first thin film transistor will be etched off in a subsequent process, it still will affect performance of the active layer 4 of the first thin film transistor, meanwhile, processing for the active layer 5 of the second thin film transistor will also affect the performance of the active layer 4 of the first thin film transistor, for example, plasma processing for the active layer 5 of the second thin film transistor may result in plasma bombardment damage of the active layer 4 of the first thin film transistor, in addition, processes such as high energy process (e.g., doping modification) and annealing in different atmospheres may also affect the performance of CMOS TFT, which results in deterioration of properties of CMOS TFT, for example, threshold voltage, subthreshold swing, stability, etc. of CMOS TFT may be deteriorated.

SUMMARY OF THE INVENTION

In view of above defects existing in the complementary thin film transistor in the prior art, an object of the present invention is to provide a complementary thin film transistor and a manufacturing method thereof, an array substrate, a display apparatus with stable performance.

In order to achieve the above object, the present invention provides a manufacturing method of complementary thin film transistor, comprising steps of: forming a pattern comprising an active layer of a first thin film transistor and a protective layer on a base by a patterning process, and the protective layer is at least located above the active layer of the thin film transistor; and forming a pattern of an active layer of a second thin film transistor on the base subjected to above step by a patterning process.

In the manufacturing method of complementary thin film transistor of the present invention, a protective layer is provided above the active layer of the first thin film transistor, thus effect on performance of the active layer of the first thin film transistor due to difference between materials of the active layers of the first and second thin film transistors may be avoided when the active layer of the second thin film transistor is manufactured, thereby performance of the complementary thin film transistor may be improved.

Preferably, the step of forming a pattern comprising an active layer of a first thin film transistor and a protective layer on a base specifically comprises: sequentially depositing an active layer thin film of the first thin film transistor and a protective layer thin film on the base; and forming the pattern comprising the active layer of the first thin film transistor and the protective layer simultaneously on the base subjected to above step by a single patterning process.

Preferably, the step of forming a pattern comprising an active layer of a first thin film transistor and a protective layer on a base specifically comprises: forming an active layer thin film of the first thin film transistor; forming a pattern of the active layer of the first thin film transistor on the base subjected to above step by a patterning process; forming a protective layer thin film on the base subjected to above steps; and forming a pattern of the protective layer on the base subjected to above steps by a patterning process.

Further preferably, the manufacturing method further comprises steps of: before forming the protective layer thin film, processing the active layer of the first thin film transistor by plasma modifying or sputtering doping; and/or, after forming the pattern of the active layer of the second thin film transistor, processing the active layer of the second thin film transistor by plasma modifying or sputtering doping.

Preferably, the active layer of the first thin film transistor is formed of first semiconductor material, the active layer of the second thin film transistor is formed of second semiconductor material, wherein, the first semiconductor material is P-type semiconductor material and the second semiconductor material is N-type semiconductor material, or the first semiconductor material is N-type semiconductor material and the second semiconductor material is P-type semiconductor material.

Preferably, the manufacturing method further comprises: before forming the pattern comprising the active layer of the first thin film transistor and the protective layer on the base, forming a pattern comprising a gate of the first thin film transistor and a gate of the second thin film transistor on the base; and forming a gate insulation layer on the base subjected to above step.

Further preferably, the manufacturing method further comprises: after forming the pattern of the active layer of the second thin film transistor on the base, forming an etching stop layer, and forming source and drain contact regions penetrating through the etching stop layer and the protective layer for making a source, a drain of the first thin film transistor to be formed and a source, a drain of the second thin film transistor to be formed contact the active layers thereof respectively; and forming a pattern comprising the source, the drain of the first thin film transistor and the source, the drain of the second thin film transistor by a patterning process, and the source, the drain of the first thin film transistor and the source, the drain of the second thin film transistor are respectively in contact with the respective active layers thereof through respective source and drain contact regions thereof.

Preferably, the protective layer is a monolayer or multilayer film formed of one or more of silicon oxide, silicon nitride, hafnium oxide, nitrogen oxide silicon and aluminum oxide.

In order to achieve the above object, the present invention also provides a complementary thin film transistor comprising a first thin film transistor and a second thin film transistor, a protective layer is provided above an active layer of the first thin film transistor for protecting the active layer of the first thin film transistor from affecting by manufacturing of the active layer of the second thin film transistor.

The protective layer is provided above the active layer of the first thin film transistor of the complementary thin film transistor of the present invention, thus adverse effect on the active layer of the first thin film transistor may be avoided when the active layer of the second thin film transistor is formed, thereby performance of the complementary thin film transistor may be improved.

Preferably, one of the first and second thin film transistors is a P-type thin film transistor, and the other is an N-type thin film transistor, one or more kinds of ions of arsenic, antimony, phosphorus are doped in the active layer of the N-type thin film transistor, one or more kinds of ions of boron, indium, gallium are doped in the active layer of the P-type thin film transistor.

Preferably, the protective layer is a monolayer or multilayer film formed of one or more of silicon oxide, silicon nitride, hafnium oxide, nitrogen oxide silicon and aluminum oxide.

In order to achieve the above object, the present invention also provides an array substrate comprising the above complementary thin film transistor.

The array substrate of the present invention comprises the above complementary thin film transistor, thus the performance thereof is more stable.

In order to achieve the above object, the present invention also provides a display apparatus comprising the above array substrate.

The display apparatus of the present invention comprises the above array substrate, thus the performance thereof is more stable.

Reference symbols: 1, base; 21, gate of first thin film transistor; 22, gate of second thin film transistor; 3, gate insulation layer; 4, active layer of first thin film transistor; 5, active layer of second thin film transistor; 6, etching stop layer; 71, source of first thin film transistor; 72, drain of first thin film transistor; 81, source of second thin film transistor; 82, drain of second thin film transistor; 9, protective layer; 10, passivation layer; 11, metal electrode.

DETAILED DESCRIPTION OF THE EMBODIMENTS

In order to make a person skilled in the art better understand the technical solutions of the present invention, the present invention will be described in detail below in combination with the accompanying drawings and specific implementations.

First Embodiment

Figure 1:
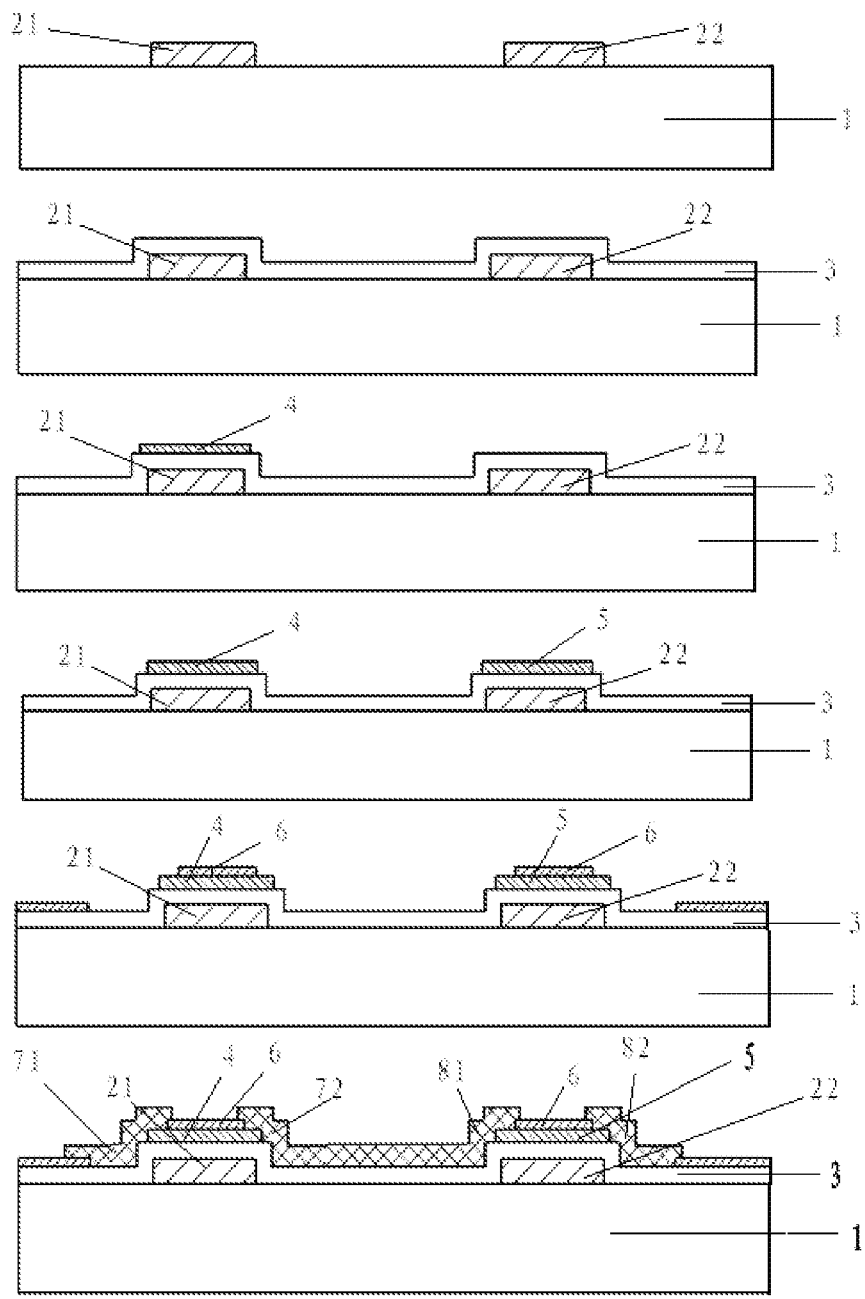
FIG. 1 is a cross-sectional diagram of a structure formed by steps of a manufacturing method of complementary thin film transistor in the prior art.
Figure 2:
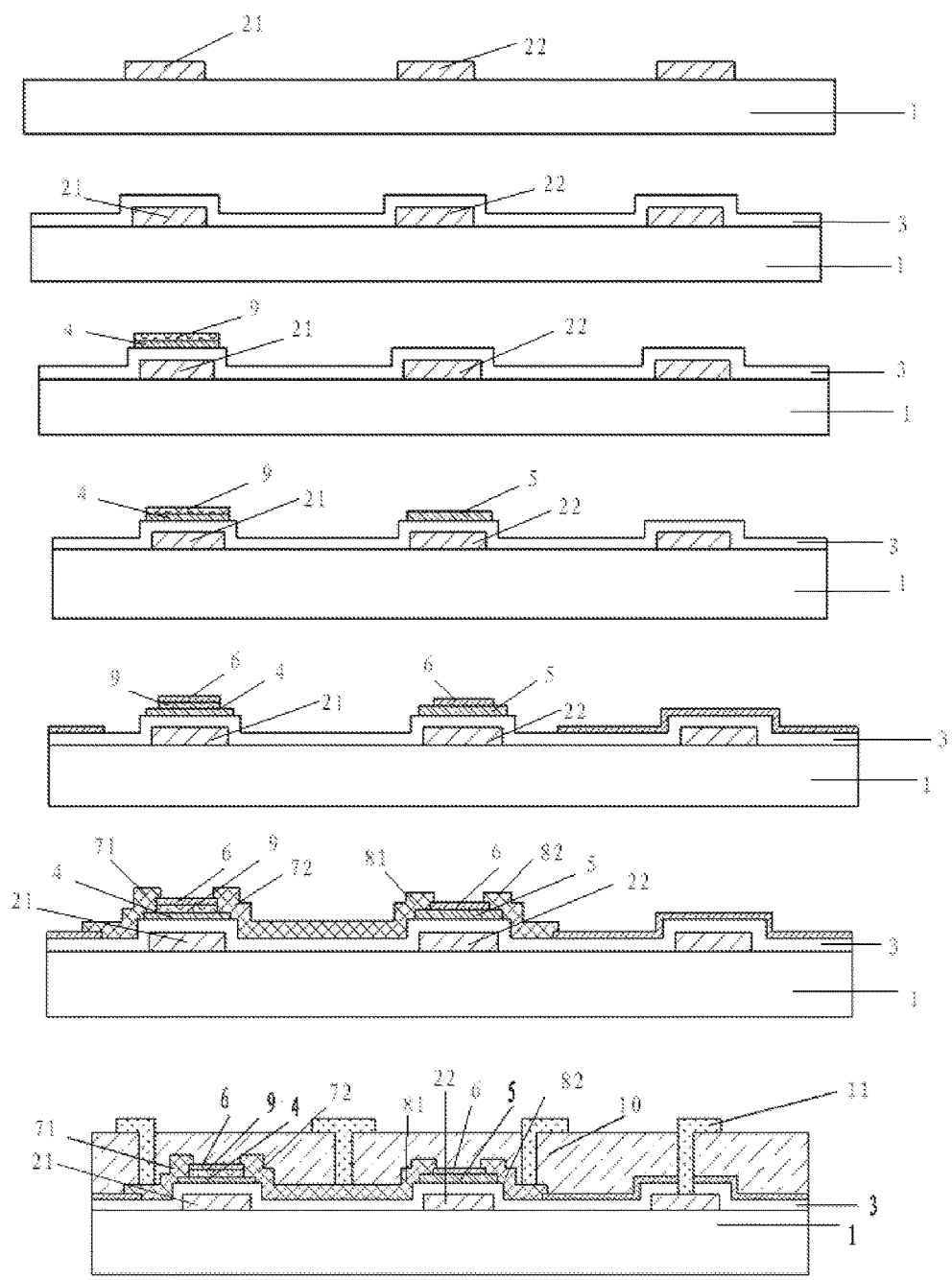
FIG. 2 is a cross-sectional diagram of a structure formed by steps of a manufacturing method of complementary thin film transistor in accordance with a first embodiment of the present invention.

As shown in FIG. 2, the present embodiment provides a manufacturing method of a complementary thin film transistor, the complementary thin film transistor comprises a first thin film transistor and a second thin film transistor, one of the first and second thin film transistors is a P-type thin film transistor, and the other is an N-type thin film transistor, that is to say, the first thin film transistor is the P-type thin film transistor and the second thin film transistor is the N-type thin film transistor, or the first thin film transistor is the N-type thin film transistor and the second thin film transistor is the P-type thin film transistor. The manufacturing method specifically comprises following steps of 1 through 8.

Step 1, depositing a layer of gate metal layer thin film on a base 1 by using a method of magnetron sputtering, and forming a pattern of a gate metal layer comprising a gate 21 of the first thin film transistor, a gate 22 of the second thin film transistor and gate lines by a patterning process, wherein, the gate 21 of the first thin film transistor and the gate 22 of the second thin film transistor are electrically connected together.

It should be noted that, the base 1 may mean a substrate (e.g., a white glass plate) without any film thereon, or mean a substrate (e.g., a substrate formed with a buffer layer thereon) formed with other films or patterns thereon. The patterning process generally includes processes of photoresist applying, exposure, developing, etching, photoresist stripping, etc. That is, in the above step, a gate metal layer thin film is first formed, and photoresist is applied to cover the gate metal layer thin film, then, exposure is performed by using a mask plate to form an exposed region and a non-exposed region, and developing is performed to remove the photoresist of the exposed region (taking positive photoresist as an example), the photoresist of the non-exposed region is remained, then, the gate metal layer thin film is etched, the gate metal layer thin film of the non-exposed region is not etched off due to protection of the photoresist, finally, the photoresist is stripped off to form a pattern of a gate metal layer comprising the gate 21 of the first thin film transistor, the gate 22 of the second thin film transistor and the gate lines.

In the present embodiment, the gate metal layer thin film may be a monolayer or multilayer composite film formed of one or more of molybdenum (Mo), alloy of molybdenum and niobium (MoNb), aluminum (Al), alloy of aluminum and neodymium (AlNd), titanium (Ti) and copper (Cu), and preferably, is a monolayer or multilayer composite film formed of Mo, Al or alloy containing Mo and Al.

Step 2, forming a gate insulation layer 3 on the base 1 subjected to above step by using a manufacturing method of thermal growing, atmospheric pressure chemical vapor depositing, low pressure chemical vapor depositing, plasma assistant chemical vapor depositing, sputtering, or the like.

In the present embodiment, the gate insulation layer 3 may be a monolayer or multilayer composite film formed of silicon oxide (SiOx), silicon nitride (SiNx), hafnium oxide (HfOx), nitrogen oxide silicon (SiON), aluminum oxide (AlOx), or the like.

Step 3, forming a pattern comprising an active layer 4 of the first thin film transistor and a protective layer 9 on the base 1 subjected to above steps by a patterning process, and the protective layer 9 is at least located above the active layer 4 of the first thin film transistor.

Preferably, the step 3 specifically comprises: sequentially depositing an active layer thin film of the first thin film transistor and a protective layer thin film by a process of spray applying, vacuum evaporating, sol-gel, magnetron sputtering or the like, and forming a pattern comprising the active layer 4 of the first thin film transistor and the protective layer 9 simultaneously by a single patterning process, wherein, the active layer 4 of the first thin film transistor is formed of a first semiconductor material, and the first semiconductor material is P-type or N-type semiconductor material, this method is simple and is easily implemented. Of course, this step may further comprise: forming an active layer thin film of the first thin film transistor, and doping the active layer thin film by an ion implantation method so as to form the active layer 4 of the first thin film transistor. For example, a stannum oxide (SnOx) material layer is first formed, and an active layer of the first thin film transistor is formed by a patterning process, then one or more kinds of ions of arsenic, antimony, phosphorus are doped in the active layer of the first thin film transistor to form the active layer 4 of a N-type thin film transistor, or one or more kinds of ions of boron, indium, gallium are doped in the active layer of the first thin film transistor to form the active layer 4 of a P-type thin film transistor.

Since patterns of the protective layer 9 and the active layer 4 of the first thin film transistor are formed synchronously by a single patterning process, process steps of exposure, developing, etc. will not be increased.

Optionally, the step 3 may further comprise: forming an active layer thin film of the first thin film transistor, and forming a pattern of the active layer 4 of the first thin film transistor on the base 1 by a patterning process, then forming a protective layer thin film on the base 1 subjected to the above step, and forming a pattern of the protective layer 9 by a patterning process.

It should be noted that, the protective layer 9 formed in this step may only cover the active layer 4 of the first thin film transistor, or steps of exposure, developing, etc. may not be performed on the protective layer thin film, and the protective layer 9 is directly formed on the whole base 1.

Preferably, the manufacturing method further comprises a step of: before forming the protective layer thin film, processing the active layer 4 of the first thin film transistor by plasma modifying or sputtering doping. In this case, the performance of the active layer 4 of the first thin film transistor may be further optimized.

In the present embodiment, the protective layer 9 may be a monolayer or multilayer film formed of silicon oxide (SiOx), silicon nitride (SiNx), hafnium oxide (HfOx), nitrogen oxide silicon (SiON), aluminum oxide (AlOx), and so on.

Step 4, forming an active layer thin film of the second thin film transistor on the base 1 subjected to the above steps, and forming a pattern of the active layer 5 of the second thin film transistor by a patterning process. The specific method is the same as that for forming the active layer 4 of the first thin film transistor except for the material to be used, thus will not be repeated here.

Preferably, the manufacturing method further comprises a step of: after forming the pattern of the active layer 5 of the second thin film transistor, processing the active layer 5 of the second thin film transistor by plasma modifying or sputtering doping. In this case, the performance of the active layer 5 of the second thin film transistor may be further optimized.

Step 5, forming an etching stop layer 6 on the base 1 subjected to the above steps, and forming source and drain contact regions penetrating through the etching stop layer 6 and the protective layer 9 for making the source 71, the drain 72 of the first thin film transistor and the source 81, the drain 82 of the second thin film transistor to be formed respectively contact the respective active layers thereof.

In the present embodiment, the etching stop layer 6 may be a monolayer or multilayer film formed of silicon oxide (SiOx), silicon nitride (SiNx), hafnium oxide (HfOx), nitrogen oxide silicon (SiON), aluminum oxide (AlOx), and so on.

Step 6, forming a source and drain metal layer thin film on the base 1 subjected to the above steps, and forming a pattern comprising the source 71, the drain 72 of the first thin film transistor and the source 81, the drain 82 of the second thin film transistor by a patterning process, and the source 71, the drain 72 of the first thin film transistor and the source 81, the drain 82 of the second thin film transistor are in contact with the respective active layers respectively through the respective source and drain contact regions.

In the present embodiment, the material of the source and drain metal layer thin film may be one or more of molybdenum (Mo), alloy of molybdenum and niobium (MoNb), aluminum (Al), alloy of aluminum and neodymium (AlNd), titanium (Ti) and copper (Cu), and preferably, is material of Mo, Al or alloy containing Mo and Al.

Step 7, forming a passivation layer 10 on the base 1 subjected to the above steps, and forming contact holes penetrating through the passivation layer 10 above the electrodes (i.e., the gate, the source and the drain), so that the electrodes are led out through the contact holes by using a metal electrode 11.

Step 8, annealing the product subjected to the above steps in vacuum, nitrogen or oxygen environment, temperature of annealing may be between 120° C. and 400° C., and a complementary thin film transistor is finally formed.

In the manufacturing method of the complementary thin film transistor in the present embodiment, the protective layer 9 is provided above the active layer 4 of the first thin film transistor, thus effect on performance of the active layer 4 of the first thin film transistor due to difference between materials of the active layers of the first and second thin film transistors may be avoided when the active layer 5 of the second thin film transistor is manufactured, thereby performance of the complementary thin film transistor may be improved.

It should be noted that, the first and second thin film transistors in the complementary thin film transistor manufactured by the above manufacturing method are bottom gate type thin film transistors. Of course, the first and second thin film transistors may be manufactured as top gate type thin film transistors, the steps of the manufacturing method are substantially the same as the above steps except for the sequence of the steps of forming the respective structures, for example, steps of manufacturing the first and second thin film transistors of top gate type may include: forming the pattern comprising the active layer 4 of the first thin film transistor and the protective layer 9 on the base 1 by a patterning process; forming the pattern of the active layer 5 of the second thin film transistor on the base 1 subjected to the above step by a patterning process; forming the pattern comprising the source 71, the drain 72 of the first thin film transistor and the source 81, the drain 82 of the second thin film transistor simultaneously on the base 1 subjected to the above steps by a patterning process; forming the gate insulation layer 3 on the base 1 subjected to the above steps; forming the pattern comprising the gate 21 of the first thin film transistor and the gate 22 of the second thin film transistor simultaneously on the base 1 subjected to the above steps by a patterning process; forming a planarization layer on the base 1 subjected to the above steps; forming contact holes penetrating through the planarization layer and the gate insulation layer 3 on the base 1 subjected to the above steps, the contact holes are used for making the source 71, the drain 72 of the first thin film transistor and the source 81, the drain 82 of the second thin film transistor respectively contact the respective active layers thereof. Other steps are similar to those for manufacturing the first and second thin film transistors of bottom gate type, and will not be described in detail here.

Figure 3:
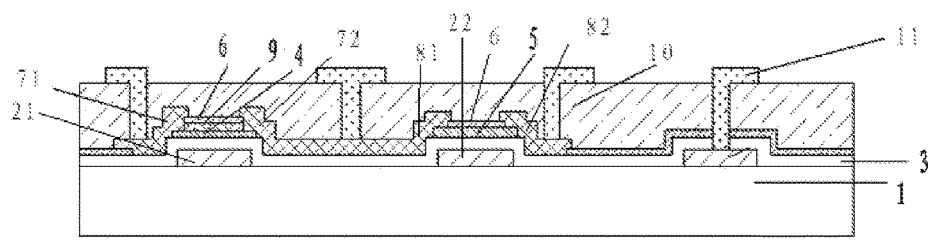
FIG. 3 is a cross-sectional diagram of a structure of a complementary thin film transistor in accordance with a second embodiment of the present invention.

It should be noted that, as shown in FIGS. 2 and 3, the gate patterns expect for the gate 21 of the first thin film transistor and the gate 22 of the second thin film transistor are the gates of other thin film transistors on the base 1. Since the figures only show cross-sectional diagrams, the cross-sectional diagrams only show the gates of the other thin film transistors. In addition, the first and second thin film transistors are not limited to top gate type or bottom gate type, and they may be thin film transistors with other structures, which will not be described one by one here.

Second Embodiment

As shown in FIG. 3, the present embodiment provides a complementary thin film transistor comprising a first thin film transistor and a second thin film transistor, a protective layer is provided above an active layer of the first thin film transistor, wherein, one of the first and second thin film transistors is a P-type thin film transistor, and the other is an N-type thin film transistor.

The complementary thin film transistor may be manufactured by the method of the first embodiment, since the protective layer 9 is provided above the active layer 4 of the first thin film transistor, thus adverse effect on the active layer 4 of the first thin film transistor may be avoided when the active layer 5 of the second thin film transistor is formed, thereby performance of the complementary thin film transistor may be improved.

In the present embodiment, the first thin film transistor is the P-type thin film transistor and the second thin film transistor is the N-type thin film transistor, or, the first thin film transistor is the N-type thin film transistor and the second thin film transistor is the P-type thin film transistor. Preferably, one or more kinds of ions of arsenic, antimony, phosphorus are doped in the active layer of the N-type thin film transistor, and one or more kinds of ions of boron, indium, gallium are doped in the active layer of the P-type thin film transistor. In this case, the performance of the complementary thin film transistor may be further improved.

Third Embodiment

The present embodiment provides an array substrate comprising the above complementary thin film transistor, of course, the array substrate further comprises other structures such as pixel electrode, common electrode and so on.

Since the array substrate of the present embodiment comprises the above complementary thin film transistor, the performance thereof is more stable.

Fourth Embodiment

The present embodiment provides a display apparatus comprising the above array substrate. The display apparatus may be any product or member with display function, such as a phone, a tablet computer, a TV, a monitor, a notebook computer, a digital photo frame, a navigator, or the like.

The display apparatus of the present embodiment comprises the array substrate of the third embodiment, thus the performance thereof is better.

Of course, the display apparatus of the present embodiment may further comprise other conventional structures such as power source, display drive unit and so on.

It could be understood that, the above implementations are merely exemplary implementations adopted for describing the principle of the present invention, rather than limiting the present invention. Various variations and improvements may be made for those of ordinary skill in the art without departing from the spirit and essence of the present invention, and these variations and improvements are regarded within the protection scope of the present invention.

The invention claimed is:

1. A manufacturing method of complementary thin film transistor, comprising steps of:
   first, forming a pattern comprising a gate of a first thin film transistor and a gate of a second thin film transistor on a base;
   then, forming a gate insulation layer on the base;
   then, forming a pattern comprising an active layer of the first thin film transistor and a protective layer on the base by a patterning process, and the protective layer is at least located above the active layer of the first thin film transistor;

then, forming a pattern of an active layer of the second thin film transistor by a patterning process on the base;

then, forming an etching stop layer, and forming source and drain contact regions penetrating through the etching stop layer and the protective layer for making a source of the first thin film transistor, a drain of the first thin film transistor to be formed and a source of the second thin film transistor, a drain of the second thin film transistor to be formed contact the respective active layers thereof respectively; and then, forming a pattern comprising the source of the first thin film transistor, the drain of the first thin film transistor and the source of the second thin film transistor, the drain of the second thin film transistor by a patterning process, and the source of the first thin film transistor, the drain of the first thin film transistor and the source of the second thin film transistor, the drain of the second thin film transistor are respectively in contact with the respective active layers thereof through respective source and drain contact regions thereof.

2. The manufacturing method of claim 1, wherein the step of forming a pattern comprising an active layer of the first thin film transistor and a protective layer on the base comprises:

sequentially depositing an active layer thin film of the first thin film transistor and a protective layer thin film on the base; and patterning the active layer thin film of the first thin film transistor and the protective layer thin film by a single patterning process to simultaneously form the pattern comprising the active layer of the first thin film transistor and the protective layer on the base.

3. The manufacturing method of claim 2, wherein the active layer of the first thin film transistor is formed of first semiconductor material, the active layer of the second thin film transistor is formed of second semiconductor material, wherein, the first semiconductor material is P-type semiconductor material and the second semiconductor material is N-type semiconductor material, or the first semiconductor material is N-type semiconductor material and the second semiconductor material is P-type semiconductor material.

4. The manufacturing method of claim 2, further comprises:

before forming the pattern comprising the active layer of the first thin film transistor and the protective layer on the base, first, forming a pattern comprising a gate of the first thin film transistor and a gate of the second thin film transistor on the base; and then, forming a gate insulation layer on the base.

5. The manufacturing method of claim 2, wherein the protective layer is a monolayer or multilayer film formed of one or more of silicon oxide, silicon nitride, hafnium oxide, nitrogen oxide silicon and aluminum oxide.

6. The manufacturing method of claim 1, wherein the step of forming a pattern comprising an active layer of the first thin film transistor and a protective layer on the base comprises:

first, forming an active layer thin film of the first thin film transistor on the base;

patterning the active layer thin film of the first thin film transistor by a patterning process to form a pattern of the active layer of the first thin film transistor on the base;

then, forming a protective layer thin film on the base; and patterning the protective layer thin film by a patterning process to form a pattern of the protective layer.

7. The manufacturing method of claim 6, further comprises steps of:

before forming the protective layer thin film, processing the active layer of the first thin film transistor by plasma modifying or sputtering doping; and/or, after forming the pattern of the active layer of the second thin film transistor, processing the active layer of the second thin film transistor by plasma modifying or sputtering doping.

8. The manufacturing method of claim 7, wherein the active layer of the first thin film transistor is formed of first semiconductor material, the active layer of the second thin film transistor is formed of second semiconductor material, wherein, the first semiconductor material is P-type semiconductor material and the second semiconductor material is N-type semiconductor material, or the first semiconductor material is N-type semiconductor material and the second semiconductor material is P-type semiconductor material.

9. The manufacturing method of claim 7, further comprises:

before forming the pattern comprising the active layer of the first thin film transistor and the protective layer on the base, first, forming a pattern comprising a gate of the first thin film transistor and a gate of the second thin film transistor on the base; and then, forming a gate insulation layer on the base.

10. The manufacturing method of claim 6, wherein the active layer of the first thin film transistor is formed of first semiconductor material, the active layer of the second thin film transistor is formed of second semiconductor material, wherein, the first semiconductor material is P-type semiconductor material and the second semiconductor material is N-type semiconductor material, or the first semiconductor material is N-type semiconductor material and the second semiconductor material is P-type semiconductor material.

11. The manufacturing method of claim 6, further comprises:

before forming the pattern comprising the active layer of the first thin film transistor and the protective layer on the base, first, forming a pattern comprising a gate of the first thin film transistor and a gate of the second thin film transistor on the base; and then, forming a gate insulation layer on the base.

12. The manufacturing method of claim 1, wherein the active layer of the first thin film transistor is formed of first semiconductor material, the active layer of the second thin film transistor is formed of second semiconductor material, wherein, the first semiconductor material is P-type semiconductor material and the second semiconductor material is N-type semiconductor material, or the first semiconductor material is N-type semiconductor material and the second semiconductor material is P-type semiconductor material.

13. The manufacturing method of claim 1, wherein the protective layer is a monolayer or multilayer film formed of one or more of silicon oxide, silicon nitride, hafnium oxide, nitrogen oxide silicon and aluminum oxide.

* * * * *